United States Patent
Lomp et al.

(10) Patent No.: US 7,593,453 B2
(45) Date of Patent: *Sep. 22, 2009

(54) EFFICIENT MULTIPATH CENTROID TRACKING CIRCUIT FOR A CODE DIVISION MULTIPLE ACCESS (CDMA) SYSTEM

(75) Inventors: Gary R. Lomp, Centerport, NY (US); Faith Ozluturk, Port Washington, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 923 days.

This patent is subject to a terminal disclaimer.

(21) Appl. No.: 10/788,209

(22) Filed: Feb. 26, 2004

(65) Prior Publication Data

US 2004/0165654 A1    Aug. 26, 2004

Related U.S. Application Data (63) Continuation of application No. 10/071,899, filed on Feb. 8, 2002, now Pat. No. 6,744,809, which is a continuation of application No. 09/261,689, filed on Mar. 3, 1999, now Pat. No. 6,381,264, which is a continuation of application No. 08/669,771, filed on Jun. 27, 1996, now Pat. No. 5,912,919.

(60) Provisional application No. 60/000,775, filed on Jun. 30, 1995.

(51) Int. Cl.
*H04B 1/69* (2006.01)
*H04B 1/707* (2006.01)
*H04B 1/713* (2006.01)

(52) U.S. Cl. .................. 375/149; 375/145; 375/367; 370/515

(58) Field of Classification Search ................. 375/149, 375/145, 134, 137, 148, 362, 367; 370/515, 370/516, 517
See application file for complete search history.

(56) References Cited

U.S. PATENT DOCUMENTS 3,761,610 A    9/1973    Krallinger et al.

(Continued)

FOREIGN PATENT DOCUMENTS

DE    3743731    7/1989

(Continued)

OTHER PUBLICATIONS

Komo J, KimC:"implementation consideration of code division multiple access sequences" $23^{RD}$ Southerstem Symposium On System Theory, Mar. 12, 1991, pp. 11-15.

(Continued)

*Primary Examiner*—Phuong Phu
(74) *Attorney, Agent, or Firm*—Volpe and Koenig, P.C.

(57) ABSTRACT

A spread spectrum signal having an associated code is tracked at a receiver. A plurality of components of the spread spectrum signal are despread using the associated code. Each of the plurality of components has a different code phase than all others of the plurality of code phases. Each of the plurality of components is weighted based on a phase difference between that component and a center code phase associated with the plurality of components. A tracking error is determined based on the weighted components.

12 Claims, 5 Drawing Sheets

U.S. PATENT DOCUMENTS

| | | | |
|---|---|---|---|
| 4,069,392 A | 1/1978 | Goldenberg et al. | |
| 4,156,277 A | 5/1979 | Seitz et al. | |
| 4,292,623 A | 9/1981 | Eswaran et al. | |
| 4,320,513 A | 3/1982 | Lampert | |
| 4,384,307 A | 5/1983 | Kuzmik et al. | |
| 4,385,206 A | 5/1983 | Bradshaw et al. | |
| 4,403,322 A | 9/1983 | Kato et al. | |
| 4,425,665 A | 1/1984 | Stauffer | |
| 4,458,314 A | 7/1984 | Grimes | |
| 4,480,307 A | 10/1984 | Budde et al. | |
| 4,570,220 A | 2/1986 | Tetrick et al. | |
| 4,583,124 A | 4/1986 | Tsuji et al. | |
| 4,608,700 A | 8/1986 | Kirtley, Jr. et al. | |
| 4,630,126 A | 12/1986 | Kaku et al. | |
| 4,646,232 A | 2/1987 | Chang et al. | |
| 4,667,192 A | 5/1987 | Schmid et al. | |
| 4,675,865 A | 6/1987 | DeVries et al. | |
| 4,709,343 A | 11/1987 | Van Cang | |
| 4,744,079 A | 5/1988 | Csapo et al. | |
| 4,768,145 A | 8/1988 | Wheelwright et al. | |
| 4,785,463 A | 11/1988 | Janc et al. | |
| 4,811,262 A | 3/1989 | White | |
| 4,811,421 A | 3/1989 | Havel et al. | |
| 4,862,402 A | 8/1989 | Shah et al. | |
| 4,901,307 A | 2/1990 | Gilhousen et al. | |
| 4,914,574 A | 4/1990 | Terada et al. | |
| 5,022,049 A | 6/1991 | Abrahamson et al. | |
| 5,050,004 A | 9/1991 | Morton, Jr. | |
| 5,056,109 A | 10/1991 | Gilhousen et al. | |
| 5,081,643 A | 1/1992 | Schilling | |
| 5,084,900 A | 1/1992 | Taylor | |
| 5,093,840 A | 3/1992 | Schilling | |
| 5,101,416 A | 3/1992 | Fenton et al. | |
| 5,103,459 A | 4/1992 | Gilhousen et al. | |
| 5,105,423 A | 4/1992 | Tanaka et al. | |
| 5,109,390 A | 4/1992 | Gilhousen et al. | |
| 5,113,525 A | 5/1992 | Andoh | |
| 5,115,429 A | 5/1992 | Hluchyj et al. | |
| 5,117,385 A | 5/1992 | Gee | |
| 5,140,613 A | 8/1992 | Birgenheier et al. | |
| 5,159,283 A | 10/1992 | Jensen | |
| 5,159,551 A | 10/1992 | Brunnett et al. | |
| 5,166,951 A | 11/1992 | Schilling | |
| 5,166,952 A | 11/1992 | Omura et al. | |
| 5,193,094 A | 3/1993 | Viterbi | |
| 5,199,061 A | 3/1993 | Kim | |
| 5,204,876 A | 4/1993 | Bruckert et al. | |
| 5,224,120 A | 6/1993 | Schilling | |
| 5,228,054 A | 7/1993 | Rueth et al. | |
| 5,228,056 A | 7/1993 | Schilling | |
| 5,235,614 A | 8/1993 | Bruckert et al. | |
| 5,237,586 A | 8/1993 | Bottomley | |
| 5,241,690 A | 8/1993 | Larsson et al. | |
| 5,245,629 A | 9/1993 | Hall | |
| 5,253,268 A | 10/1993 | Omura et al. | |
| 5,253,347 A | 10/1993 | Bagnoli et al. | |
| 5,257,283 A | 10/1993 | Gilhousen et al. | |
| 5,258,940 A | 11/1993 | Coker et al. | |
| 5,260,967 A | 11/1993 | Schilling | |
| 5,262,974 A | 11/1993 | Hausman et al. | |
| 5,265,119 A | 11/1993 | Gilhousen et al. | |
| 5,267,262 A | 11/1993 | Wheatley, III | |
| 5,274,474 A | 12/1993 | Medina | |
| 5,276,684 A | 1/1994 | Pearson | |
| 5,276,907 A | 1/1994 | Meidan | |
| 5,283,536 A | 2/1994 | Wheatley, III et al. | |
| 5,287,299 A | 2/1994 | Lin | |
| 5,287,463 A | 2/1994 | Frame et al. | |
| 5,293,641 A | 3/1994 | Kallin et al. | |
| 5,295,152 A | 3/1994 | Gudmundson et al. | |
| 5,297,162 A | 3/1994 | Lee et al. | |
| 5,299,226 A | 3/1994 | Schilling | |
| 5,299,228 A | 3/1994 | Hall | |
| 5,305,349 A | 4/1994 | Dent | |
| 5,309,474 A | 5/1994 | Gilhousen et al. | |
| 5,311,459 A | 5/1994 | D'Luna et al. | |
| 5,327,455 A | 7/1994 | DeGaudenzi et al. | |
| 5,327,467 A | 7/1994 | DeGaudenzi et al. | |
| 5,329,547 A | 7/1994 | Ling et al. | |
| 5,339,174 A | 8/1994 | Harris | |
| 5,341,396 A | 8/1994 | Higgins et al. | |
| 5,341,427 A | 8/1994 | Hardy et al. | |
| 5,343,335 A | 8/1994 | Hara | |
| 5,345,598 A | 9/1994 | Dent | |
| 5,347,536 A | 9/1994 | Meehan | |
| 5,349,606 A | 9/1994 | Lovell et al. | |
| 5,351,134 A | 9/1994 | Yaguchi et al. | |
| 5,353,302 A | 10/1994 | Bi | |
| 5,353,352 A | 10/1994 | Dent et al. | |
| 5,355,453 A | 10/1994 | Row et al. | |
| 5,361,276 A | 11/1994 | Subramanian | |
| 5,363,377 A | 11/1994 | Sharpe | |
| 5,365,544 A | 11/1994 | Schilling | |
| 5,365,585 A | 11/1994 | Puhl et al. | |
| 5,367,533 A | 11/1994 | Schilling | |
| 5,373,502 A | 12/1994 | Turban | |
| 5,377,183 A | 12/1994 | Dent | |
| 5,379,242 A | 1/1995 | Rose et al. | |
| 5,390,207 A | 2/1995 | Fenton et al. | |
| 5,392,287 A | 2/1995 | Tiedemann, Jr. et al. | |
| 5,396,516 A | 3/1995 | Padovani et al. | |
| 5,396,539 A | 3/1995 | Slekys et al. | |
| 5,398,243 A | 3/1995 | Aguilhon et al. | |
| 5,404,376 A | 4/1995 | Dent | |
| 5,406,559 A | 4/1995 | Edem et al. | |
| 5,414,728 A | 5/1995 | Zehavi | |
| 5,414,729 A | 5/1995 | Fenton | |
| 5,414,732 A | 5/1995 | Kaufmann | |
| 5,416,797 A | 5/1995 | Gilhousen et al. | |
| 5,418,624 A | 5/1995 | Ahmed | |
| 5,420,850 A | 5/1995 | Umeda et al. | |
| 5,420,864 A | 5/1995 | Dahlin et al. | |
| 5,420,896 A | 5/1995 | Schilling | |
| 5,422,908 A | 6/1995 | Schilling | |
| 5,430,724 A | 7/1995 | Fall et al. | |
| 5,430,760 A | 7/1995 | Dent | |
| 5,440,597 A | 8/1995 | Chung et al. | |
| 5,442,625 A | 8/1995 | Gitlin et al. | |
| 5,442,662 A | 8/1995 | Fukasawa et al. | |
| 5,446,683 A | 8/1995 | Mullen et al. | |
| 5,446,756 A | 8/1995 | Mallinckrodt | |
| 5,448,600 A | 9/1995 | Lucas | |
| 5,459,759 A | 10/1995 | Schilling | |
| 5,483,549 A | 1/1996 | Weinberg et al. | |
| 5,485,486 A | 1/1996 | Gilhousen et al. | |
| 5,487,089 A | 1/1996 | Misaizu et al. | |
| 5,487,180 A | 1/1996 | Ohtake | |
| 5,488,629 A | 1/1996 | Takahashi et al. | |
| 5,506,864 A | 4/1996 | Schilling | |
| 5,509,126 A | 4/1996 | Oprescu et al. | |
| 5,519,736 A | 5/1996 | Ishida | |
| 5,528,593 A | 6/1996 | English et al. | |
| 5,528,624 A | 6/1996 | Kaku et al. | |
| 5,535,278 A | 7/1996 | Cahn et al. | |
| 5,541,606 A | 7/1996 | Lennen | |
| 5,544,156 A | 8/1996 | Teder et al. | |
| 5,548,613 A | 8/1996 | Kaku et al. | |
| 5,550,811 A | 8/1996 | Kaku et al. | |
| 5,559,790 A | 9/1996 | Yano et al. | |
| 5,561,669 A | 10/1996 | Lenney et al. | |
| 5,563,907 A | 10/1996 | Lomp | |
| 5,563,912 A | 10/1996 | Yasunaga | |
| 5,566,165 A | 10/1996 | Sawahashi et al. | |
| 5,566,201 A | 10/1996 | Ostman | |

| | | | | | | |
|---|---|---|---|---|---|---|
| 5,568,483 | A | 10/1996 | Padovani et al. | 6,865,168 B1 | 3/2005 | Sekine |
| 5,570,349 | A | 10/1996 | Bustamante et al. | 6,907,020 B2 | 6/2005 | Periyalwar |
| 5,574,754 | A | 11/1996 | Kurihara et al. | 7,039,029 B2 | 5/2006 | Lee et al. |
| 5,574,983 | A | 11/1996 | Douzono et al. | 7,050,481 B1 | 5/2006 | Hulbert |
| 5,582,851 | A | 12/1996 | Hofstetter et al. | 7,061,888 B2 | 6/2006 | Sakoda |
| 5,596,570 | A | 1/1997 | Soliman | 7,079,522 B1 | 7/2006 | Kim et al. |
| 5,604,730 | A | 2/1997 | Tiedemann, Jr. | 7,339,894 B2 | 3/2008 | Corazza |
| 5,610,940 | A | 3/1997 | Durrant et al. | 7,403,508 B1 | 7/2008 | Miao |
| 5,614,914 | A | 3/1997 | Bolgiano et al. | 2001/0038630 A1 | 11/2001 | Tong et al. |
| 5,619,524 | A | 4/1997 | Ling et al. | 2002/0097697 A1 | 7/2002 | Bae et al. |
| 5,619,526 | A | 4/1997 | Kim et al. | 2002/0131376 A1 | 9/2002 | Wheatley et al. |
| 5,621,416 | A | 4/1997 | Lennen | 2002/0150065 A1 | 10/2002 | Ponnekanti |
| 5,627,835 | A | 5/1997 | Witter | 2003/0193915 A1 | 10/2003 | Lee et al. |
| 5,627,855 | A | 5/1997 | Davidovici | 2004/0179506 A1 | 9/2004 | Padovani et al. |
| 5,644,590 | A | 7/1997 | Sugita | 2005/0002348 A1 | 1/2005 | Holtzman et al. |
| 5,652,765 | A | 7/1997 | Adachi et al. | | | |
| 5,654,980 | A | 8/1997 | Latva-aho et al. | FOREIGN PATENT DOCUMENTS | | |
| 5,657,343 | A | 8/1997 | Schilling | DE | 3743731 A1 | 7/1989 |
| 5,666,654 | A | 9/1997 | Kanai | DE | 3743732 | 7/1989 |
| 5,673,286 | A * | 9/1997 | Lomp .................. 375/148 | DE | 3743732 A1 | 7/1989 |
| 5,675,581 | A | 10/1997 | Soliman | EP | 0022170 | 1/1981 |
| 5,691,974 | A | 11/1997 | Zehavi et al. | EP | 0372350 | 6/1990 |
| 5,692,008 | A | 11/1997 | Van Nee | EP | 0462572 | 12/1991 |
| 5,710,768 | A | 1/1998 | Ziv et al. | EP | 0464839 | 1/1992 |
| 5,712,869 | A | 1/1998 | Lee et al. | EP | 0464839 A2 | 1/1992 |
| 5,715,526 | A | 2/1998 | Weaver et al. | EP | 0476215 | 3/1992 |
| 5,734,648 | A | 3/1998 | Adachi et al. | EP | 0505341 | 9/1992 |
| 5,745,484 | A | 4/1998 | Scott | EP | 0505341 A | 9/1992 |
| 5,748,687 | A | 5/1998 | Ozluturk | EP | 0525860 | 2/1993 |
| 5,751,739 | A | 5/1998 | Seshadri et al. | EP | 0526106 | 2/1993 |
| 5,751,761 | A | 5/1998 | Gilhousen | EP | 0526106 A2 | 2/1993 |
| 5,764,687 | A | 6/1998 | Easton | EP | 0565507 | 10/1993 |
| 5,771,451 | A | 6/1998 | Takai et al. | EP | 0615395 | 3/1994 |
| 5,790,591 | A | 8/1998 | Gold et al. | EP | 0631397 | 12/1994 |
| 5,799,010 | A | 8/1998 | Lomp et al. | EP | 0637178 A | 2/1995 |
| 5,812,593 | A | 9/1998 | Kaku | EP | 0637179 | 2/1995 |
| 5,828,662 | A | 10/1998 | Jalali et al. | EP | 0654913 | 5/1995 |
| 5,841,768 | A | 11/1998 | Ozluturk et al. | EP | 0654913 A2 | 5/1995 |
| 5,856,971 | A | 1/1999 | Gitlin et al. | EP | 0682423 | 5/1995 |
| 5,870,427 | A | 2/1999 | Tiedemann et al. | EP | 0656716 | 6/1995 |
| 5,872,810 | A | 2/1999 | Philips et al. | EP | 0656716 A1 | 6/1995 |
| 5,875,400 | A | 2/1999 | Madhavapeddy et al. | EP | 0668662 | 8/1995 |
| 5,878,350 | A | 3/1999 | Nakamura et al. | EP | 0668662 A1 | 8/1995 |
| 5,881,368 | A | 3/1999 | Grob et al. | EP | 0744876 | 11/1996 |
| 5,884,187 | A | 3/1999 | Ziv et al. | EP | 1933470 | 6/2008 |
| 5,884,196 | A | 3/1999 | Lekven et al. | GB | 2280575 | 2/1995 |
| 5,933,781 | A | 8/1999 | Willenegger et al. | GB | 2301746 | 12/1996 |
| 5,940,382 | A | 8/1999 | Haim | JP | S62-256516 | 11/1987 |
| 5,966,403 | A | 10/1999 | Pon | JP | S63-198423 | 8/1988 |
| 6,049,535 | A | 4/2000 | Ozukturk et al. | JP | S63198423 | 8/1988 |
| 6,088,324 | A | 7/2000 | Sato | JP | H02-256331 | 10/1990 |
| 6,104,748 | A | 8/2000 | Kaku | JP | H02-287874 | 11/1990 |
| 6,212,174 | B1 | 4/2001 | Lomp et al. | JP | H04-222111 | 8/1992 |
| 6,226,316 | B1 | 5/2001 | Schilling et al. | JP | H04-287593 | 10/1992 |
| 6,269,113 | B1 | 7/2001 | Park | JP | H05-083381 | 4/1993 |
| 6,272,168 | B1 | 8/2001 | Lomp et al. | JP | H5083381 | 4/1993 |
| 6,292,519 | B1 | 9/2001 | Popovic | JP | H05-129969 | 5/1993 |
| 6,335,924 | B1 | 1/2002 | Yano et al. | JP | H05-144128 | 6/1993 |
| 6,347,083 | B1 | 2/2002 | Nishino | JP | 5-227124 | 9/1993 |
| 6,356,555 | B1 | 3/2002 | Rakib et al. | JP | H06-006374 | 1/1994 |
| 6,381,264 | B1 * | 4/2002 | Lomp et al. .................. 375/149 | JP | H6006374 | 1/1994 |
| 6,396,867 | B1 | 5/2002 | Tiedemann et al. | JP | H06-104694 | 4/1994 |
| 6,397,070 | B1 | 5/2002 | Black | JP | H06-104829 | 4/1994 |
| 6,434,124 | B1 | 8/2002 | Rege | JP | H06-120865 | 4/1994 |
| 6,438,119 | B1 | 8/2002 | Kim et al. | JP | H6104829 | 4/1994 |
| 6,473,447 | B1 | 10/2002 | Strich et al. | JP | 06-268574 | 9/1994 |
| 6,539,008 | B1 | 3/2003 | Ahn et al. | JP | H07-058665 | 3/1995 |
| 6,587,447 | B1 | 7/2003 | Wang et al. | JP | H7058665 | 3/1995 |
| 6,590,883 | B1 | 7/2003 | Kitade et al. | JP | H07-273600 | 10/1995 |
| 6,654,613 | B1 | 11/2003 | Maeng et al. | JP | H7-095151 | 11/1996 |
| 6,721,301 | B2 | 4/2004 | Ozluturk et al. | WO | 9013942 | 11/1990 |
| 6,724,740 | B1 | 4/2004 | Choi et al. | WO | 9200639 | 1/1992 |
| 6,744,809 | B2 * | 6/2004 | Lomp et al. .................. 375/149 | | | |

| | | |
|---|---|---|
| WO | 9221196 | 11/1992 |
| WO | 9307702 | 4/1993 |
| WO | 9314588 | 7/1993 |
| WO | 9428640 | 12/1994 |
| WO | 9503652 | 2/1995 |
| WO | 9507578 | 3/1995 |
| WO | 9508876 | 3/1995 |
| WO | 9512257 | 5/1995 |
| WO | 9515038 | 6/1995 |
| WO | 9702665 | 1/1997 |
| WO | 9702675 | 1/1997 |
| WO | 9707600 | 2/1997 |

OTHER PUBLICATIONS

Raymond W. Neettleton, "Special Efficiency in Cellular Land-Mobile Communications: A Spread-Spectrum Approach", UMI Dissertation Information Service (1978) 204 pp.

Franz Josef Hagmanns, Volker Hespelt, "Code Division Multiple Access (CDMA)"—8273 ANT Nachrichtentechnische Berichte (1993) Aug., No. 10, Backnang, DE pp. 64-71.

"CDMA and ATM-zwei Technologien, ein Ziel", 2323 Telecom Report (Siemens) 18 (1995) Maerz/Apr., No. 2, Munchen, DE, pp. 60-63.

Franz Josef Hagmanns, Volker Hespelt, "Code Division Multiple Access (CDMA)"—8273 ANT Nachrichlentechische Berichte (1993) Aug., No. 10, Backnang, DE.

Pahlavan et al.; "Performance of adaptive matched filter receivers over fading multipath channels;" IEEE; vol. 38, No. 12; pp. 2106-2213; Dec. 1990.

Giannetti et al.; "Design of an all-digital receiver for narrowband continuous-phase asynchronous CDMA systems;" IEEE; vol. 3; pp. 468-472; May 1993.

Braun et al.; "An All-digital receiver for satellite audio broadcasting signals using trellis coded quasi-orthogonal code-division multiplexing," AEI; vol. 4, No. 1; pp. 23-32; 1993.

Rick et al.; "Noncoherent parallel acquisition in CDMA spread spectrum systems;" IEEE; paragraph 1; May 1994.

Bernasconi; "Receiver architectures for the down-link in a DS-CDMA mobile system;" IEEE; pp. 51-55; Sep. 1994.

Alavi, Power Control and Interference Management in a Spread-Spectrum Cellular Mobile Radio System, (1984) (unpublished Ph.D. thesis—Michigan State University Department of Electrical Engineering and Systems Science) (on file with the Michigan State University Libraries).

Bernasoni, "Receiver Architectures for the Down-Link in a DS-CDMA Mobile System," pp. 51-55 (IEEE, Sep. 1994).

Giannetti et al., "Design of an All-Digital Receiver for Narrowband Continuous-Phase Asynchronous CDMA Systems," vol. 3, pp. 468-472 (IEEE, May 1993).

Hagmanns et al., "Code Division Multiple Access (CDMA): das natürliche Zigroffesverfajrem für den zellularen Mobilfunk (Code Division Multiple Access (CDMA): The Natural Access Procedure for Cellular Mobile Radio Systems)," 8273 ANT Nachrichtentechnische Berichte, No. 10, pp. 64-71, (Aug. 1993, Backnang, DE). Translation of paper provided, pp. 1-17.

Komo et al., "Implementation Consideration Of Code Division Multiple Access Sequences," $23^{RD}$ Southeastern Symposium On System Theory, pp. 11-15, (Mar. 12, 1991).

Liu et al., "SIR-Based Call Admission Control for DS-CDMA Cellular Systems," IEEE Journal on Selected Areas in Communications, vol. 12, No. 14, pp. 638-644 (May 1994).

Nettleton, Spectral Efficiency in Cellular Land-Mobile Communications: A Spread Spectrum Approach, (1978) (unpublished Ph.D. thesis, Purdue University) (on file with UMI Dissertation Information Service).

Pahlavan et al., "Performance of Adaptive Matched Filter Receivers Over Fading Multipath Channels," IEEE Transactions on Communications, vol. 38, No. 12, pp. 2106-2113, (Dec. 1990).

Rick et al., "Noncoherent Parallel Acquisition in CDMA Spread Spectrum Systems," IEEE, pp. 1422-1426, (May 1994).

TIA/EIA/IS-95-A, "Mobile Station-Base Station Compatibility Standard for Dual-Mode Wideband Spread Spectrum Cellular System", TIA/EIA Interim Standard, (Telecommunications Industry Association, May 1995).

Expert Report of Mark Lanning Regarding Invalidity of U.S. Patent Numbers: 6,674,791; 7,117,004;7,190,966; and 7,286,847, In the Matter of Certain 3G Mobile Handsets And Components, Investigation No. 337-TA-613, Feb. 1, 2008.

Expert Report of Mark Lanning Regarding Invalidity of U.S. Patent Numbers: 6,674,791 and 7,190,966, In the Matter of Certain 3G Mobile Handsets And Components Thereof, Investigation No. 337-TA-601, Oct. 17, 2007.

MPT 1375, Common Air Interface Specification to be Used for the Interworking between Cordless Telephone Apparatus (May 1989).

Public Version of Respondents Nokia Corporation and Nokia Inc.'s Response to the Complaint and Notice of Investigation, In the Matter of Certain 3G Mobile Handsets And Components Thereof, Investigation No. 337-TA-613, Oct. 5, 2007.

Public Version of Respondents Nokia Corporation and Nokia Inc.'s Response to the Second Amended Complaint and Notice of Investigation, In the Matter of Certain 3G Mobile Handsets And Components Thereof, Investigation No. 337-TA-613, Dec. 31, 2007.

* cited by examiner

EFFICIENT MULTIPATH CENTROID TRACKING CIRCUIT FOR A CODE DIVISION MULTIPLE ACCESS (CDMA) SYSTEM

CROSS REFERENCE TO RELATED APPLICATION(S)

This application is a continuation of U.S. patent application Ser. No. 10/071,899, filed Feb. 8, 2002, which is a continuation of U.S. patent application Ser. No. 09/261,689, filed on Mar. 3, 1999, now U.S. Pat. No. 6,381,264, issued on Apr. 30, 2002, which is a continuation of U.S. patent application Ser. No. 08/669,771, filed on Jun. 27, 1996, now U.S. Pat. No. 5,912,919, issued on Jun. 15, 1999, which claims the benefit of U.S. Provisional Application 60/000,775 filed on Jun. 30, 1995.

BACKGROUND

The present invention generally pertains to code sequence tracking in Code Division Multiple Access (CDMA) communication systems, also known as spread-spectrum communication systems. More particularly, the present invention pertains to a system and method for efficient tracking of multipath signal components allowing for combining of multipath signal components to improve data signal detection and despreading by reducing effects of multipath interference, and increase CDMA communication system efficiency by reducing the required transmit power.

Providing quality telecommunication services to user groups which are classified as remote, such as rural telephone systems and telephone systems in underdeveloped countries, has proved to be a challenge over recent years. The past needs created by these services have been partially satisfied by wireless radio services, such as fixed or mobile frequency division multiplex (FDM), frequency division multiple access (FDMA), time division multiplex (TDM), time division multiple access (TDMA) systems, combination frequency and time division systems (FD/TDMA), and other land mobile radio systems. Usually, these remote services are faced with more potential users than can be supported simultaneously by their frequency or spectral bandwidth capacity.

Recognizing these limitations, recent advances in wireless communications have used spread spectrum modulation techniques to provide simultaneous communication by multiple users. Spread spectrum modulation refers to modulating a information signal with a spreading code signal; the spreading code signal being generated by a code generator where the period, Tc, of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence spreading (DS). Spread-spectrum modulation produces a signal with bandwidth substantially greater than that required to transmit the information signal. The original information is recovered by synchronously demodulating and despreading of the signal at the receiver. The synchronous demodulator uses a reference signal to synchronize the despreading circuits to the input spread-spectrum modulated signal to recover the carrier and information signals. The reference signal may be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which is incorporated herein by reference.

One area in which spread-spectrum techniques are used is in the field of mobile cellular communications to provide personal communication services (PCS). Such systems desirably support large numbers of users, control Doppler shift and fade, and provide high speed digital data signals with low bit error rates. These systems employ a family of orthogonal or quasi-orthogonal spreading codes, with a pilot spreading code sequence that is synchronized to the family of codes. Each user is assigned one of the spreading codes from the family as a spreading function. Related problems of such a system include handling multipath fading effects. Solutions to such problems include diversity combining of multipath signals. The problems associated with spread spectrum communications, and methods to increase capacity of a multiple access, spread-spectrum system are described in U.S. Pat. No. 4,901,307 entitled SPREAD SPECTRUM MULTIPLE ACCESS COMMUNICATION SYSTEM USING SATELLITE OR TERRESTRIAL REPEATERS by Gilhousen et al. which is incorporated herein by reference.

The problems associated with the prior art systems focus around reliable reception and synchronization of the receiver despreading circuits to the received signal. The presence of multipath fading introduces a particular problem with spread spectrum receivers in that a receiver must somehow track the multipath components to maintain code-phase lock of the receiver's despreading means with the input signal. Prior art receivers generally track only one or two of the multipath signals, but this method may not be satisfactory because the combined group of low-power multipath signal components may actually contain far more power than the one or two strongest multipath components. The prior art receivers track and combine only the strongest components to maintain a predetermined Bit Error Rate (BER) of the receiver. Such a receiver is described, for example, in U.S. Pat. No. 5,109,390 entitled DIVERSITY RECEIVER IN A CDMA CELLULAR TELEPHONE SYSTEM by Gilhousen et al. which is incorporated herein by reference. A receiver that combines all multipath components, however, is able to maintain the desired BER with a signal power that is lower than that of prior art systems because more signal power is available to the receiver. Consequently, there is a need for a spread spectrum communication system employing a receiver that tracks substantially all of the multipath signal components, so that substantially all multipath signals may be combined in the receiver. This would reduce the required transmit power of the signal for a given BER.

SUMMARY

A spread spectrum signal having an associated code is tracked at a receiver. A plurality of components of the spread spectrum signal are despread using the associated code. Each of the plurality of components has a different code phase than all others of the plurality of code phases. Each of the plurality of components is weighted based on a phase difference between that component and a center code phase associated with the plurality of components. A tracking error is determined based on the weighted components.

DETAILED DESCRIPTION OF THE PREFERRED EMBODIMENT(S)

Three CDMA spreading-code tracking methods in multipath fading environments are described which track the code phase of a received multipath spread-spectrum signal. The first is the prior art tracking circuit which simply tracks the spreading code phase with the highest detector output signal value, the second is a tracking circuit that tracks the median value of the code phase of the group of multipath signals, and the third, the system and method of the present invention, is the centroid tracking circuit which tracks the code-phase of an optimized, least mean squared weighted average of the multipath signal components. The following describes the methods by which the spreading code phase of the received CDMA signal is tracked.

Figure 1:
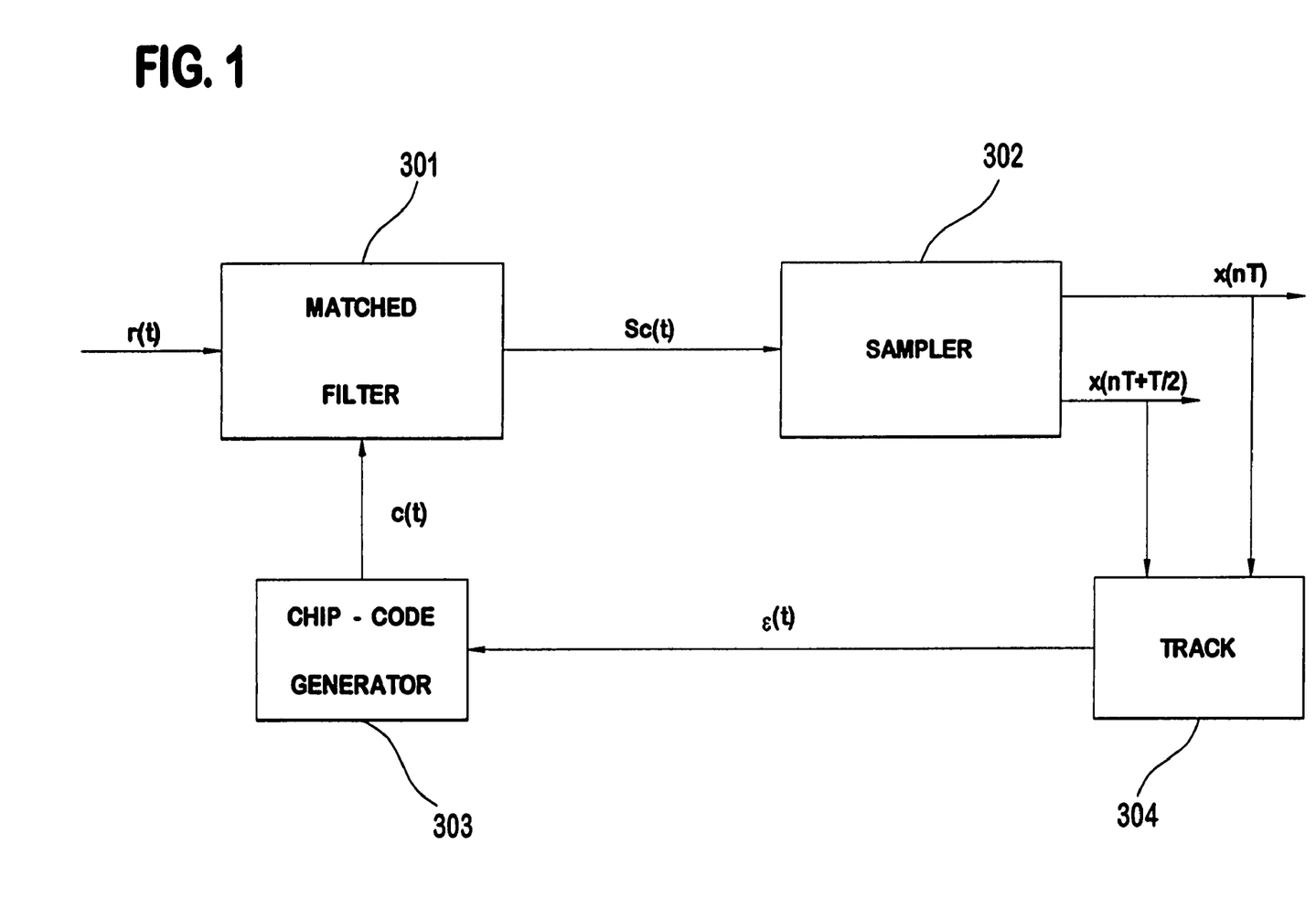
FIG. 1 is a block diagram of exemplary circuitry which implements the method of tracking the received spreading-code phase.

A tracking circuit has operating characteristics that reveal the relationship between the time error and the control voltage that drives a Voltage Controlled Oscillator (VCO) of a spreading-code phase tracking circuit. When there is a positive timing error, the tracking circuit generates a negative control voltage to offset the timing error. When there is a negative timing error, the tracking circuit generates a positive control voltage to offset the timing error. When the tracking circuit generates a zero value, this value corresponds to the perfect time alignment called the 'lock-point'. FIG. 1 shows the basic tracking circuit. Received signal r(t) is applied to matched filter 301, which correlates r(t) with a local code-sequence c(t) generated by Code Generator 303. The output signal of the matched filter x(t) is sampled at the sampler 302 to produce samples x[nT] and x[nT+T/2]. The samples x[nT] and x[nT+T/2] are used by a tracking circuit 304 to determine if the phase of the spreading-code c(t) of the code generator 303 is correct. The tracking circuit 304 produces an error signal e(t) as an input to the code generator 303. The code generator 303 uses this signal e(t) as an input signal to adjust the code-phase it generates.

Figure 2:
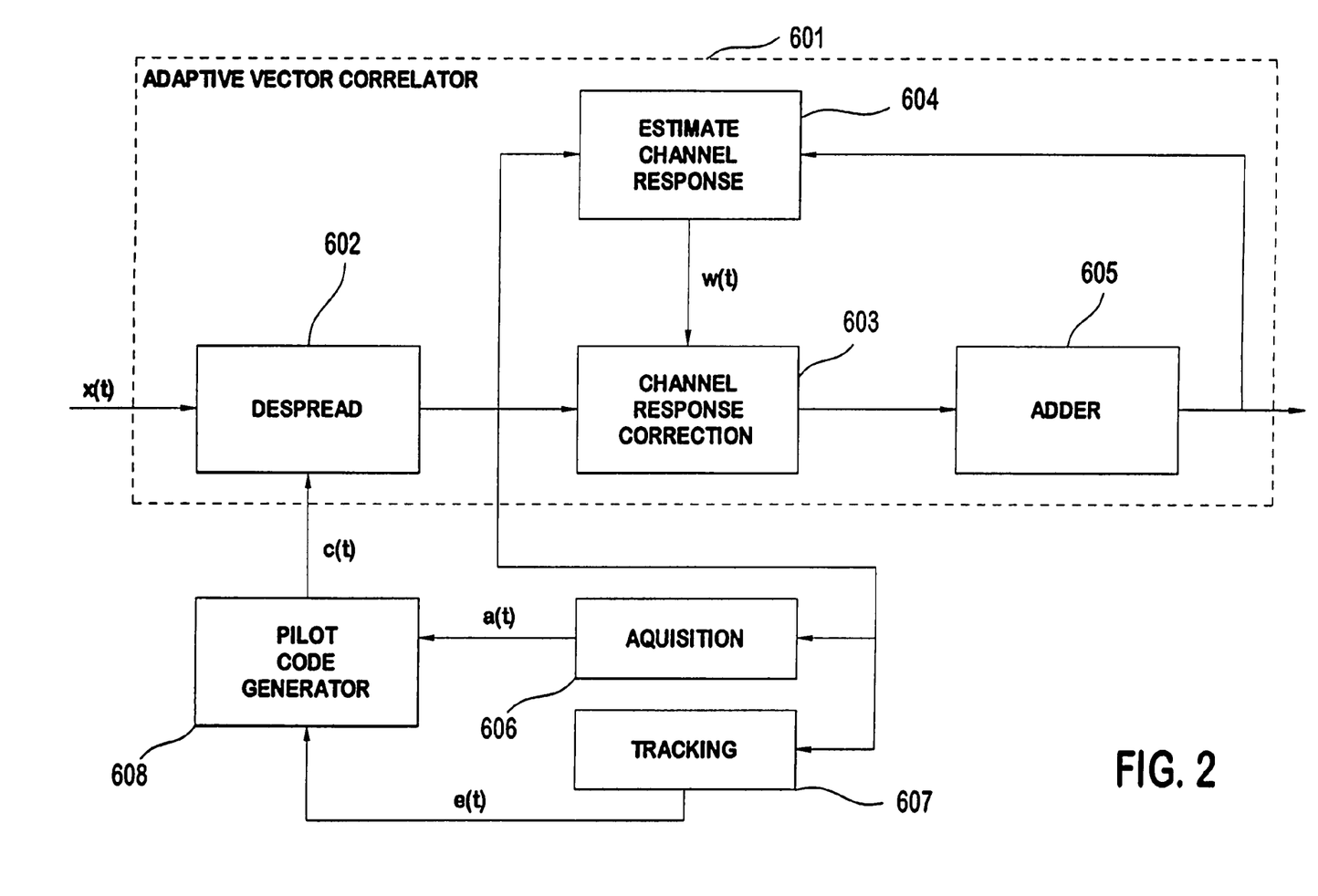
FIG. 2 is a block diagram of exemplary circuitry which implements the acquisition decision method of the correct spreading-code phase of the received pilot code of the present invention.

FIG. 2 shows the tracking circuit as it is typically used in a code division multiple access (CDMA) system receiver which uses an adaptive vector correlator (AVC) to estimate the channel impulse response and to obtain a reference value for coherent combining of received multipath signal components. For this type of system, a pilot signal is transmitted as a synchronization reference to all receivers. The described system receiver employs an array of correlators to estimate the complex channel response affecting each multipath component, the receiver then compensates for the channel response and coherently combines the received multipath signal components. This approach is referred to as maximal ratio combining.

Referring to FIG. 2, the input signal x(t) to the system includes interference noise of other message channels, multipath signals of message channels, thermal noise, and multipath signals of the pilot signal. The input signal is provided to AVC 601 which includes a despreading means 602, channel estimation means for estimating the channel response 604, correction means for correcting a signal for effects of the channel response 603, and adder 605 in the present invention. The AVC despreading means 602 is composed of multiple code correlators, with each correlator using a different phase of the pilot code c(t) provided by the pilot code generator 608. The output of this despreading means corresponds to a noise power level if the phase of the local pilot code of the despreading means is not in phase with the input code signal, or it corresponds to a received pilot signal power level plus noise power level if the input pilot code and locally generated pilot code have the same phase. The output signals of the correlators of the despreading means are corrected for the channel response by the correction means 603 and are applied to the adder 605 which collects all multipath pilot signal power. The channel response estimation means 604 receives the combined pilot signal and the output signals of the despreading means 602, and provides a channel response estimate signal, w(t), to the correction means 603 of the AVC. The output signal of the despreading means 602 is also provided to the acquisition decision means 606 which decides, based on a particular algorithm such as a sequential probability ratio test (SPRT), if the present output levels of the despreading circuits correspond to synchronization of the locally generated code to the desired input code phase. If the detector finds no synchronization, then the acquisition decision means sends a control signal a(t) to the local pilot code generator 608 to offset its phase by one or more chip period. When synchronization is found, the acquisition decision means informs tracking circuit 607, which achieves and maintains a close synchronization between the received and locally generated code sequences.

In a CDMA system, the signal, s(t), shown in Equation (1) transmitted by the reference user is written in the low-pass representation as.

$$s(t) = \sum_{k=-\infty}^{\infty} c_k P_{Tc}(t - kT_c) \quad \text{Equation 1}$$

where $c_k$ represents the spreading code coefficients, $P_{Tc}(t)$ represents the spreading code chip waveform, and $T_c$ is the chip duration. Assuming that the reference user is not transmitting data, only the spreading code modulates the carrier. Referring to FIG. 1, the received signal, r(t), is described by Equation (2)

$$r(t) = \sum_{i=1}^{M} a_i s(t - \tau_i) \quad \text{Equation 2}$$

In Equation (2), $a_i$ is an attenuation factor due to fading effect of the multipath channel on the i-th path and $\tau_i$ is the random time delay associated with the same path. The receiver passes the received signal through a matched filter, which is implemented as a correlation receiver and is described below. This operation is done in two steps: first the signal is passed through a chip matched filter and sampled to recover the spreading code chip values, then this spreading sequence is correlated with the locally generated code sequence.

FIG. 1 shows the chip matched filter 301, matched to the chip waveform $P_{Tc}(t)$, and the sampler 302. The signal x(t) at the output terminal of the chip matched filter is given by Equation (3), $$x(t) = \sum_{i=k}^{M} \sum_{k=-\infty}^{\infty} a_i c_k g(t - \tau_i - kT_c) \quad \text{Equation 3}$$

where $$g(t) = P_{Tc}(t) * h_R(t) \quad \text{Equation 4}$$

Here, $h_R(t)$ is the impulse response of the chip matched filter and "*" denotes convolution. By changing the order of the summations, Equation (3) can be rewritten as Equation (5), $$x(t) = \sum_{k=-\infty}^{\infty} c_k f(t - kT_c) \quad \text{Equation 5}$$

where $$f(t) = \sum_{i=1}^{M} a_i g(t - \tau_i) \quad \text{Equation 6}$$

In the multipath channel described above, the sampler samples the output signal of the matched filter to produce x(nT) at the maximum power level points of g(t). In practice, however, the waveform g(t) may be distorted due to the multipath signal reception, and a perfect time alignment of the signals may not be available.

When the multipath distortion in the channel is negligible and a perfect estimate of the timing is available, i.e., a1 $a_1$=1, $\tau_1$=0, and $a_i$=0, i=2, . . . , M, the received signal is r(t)=s(t). Then, with this ideal channel model, the output of the chip matched filter becomes $$x(t) = \sum_{k=-\infty}^{\infty} c_k g(t - kT_c) \quad \text{Equation 7}$$

When there is multipath fading, however, the received spreading code chip value waveform is distorted, and has a number of local maxima that can change from one sampling interval to another depending on the channel characteristics For multipath fading channels with quickly changing channel characteristics, it is not practical to try to locate the maximum of the waveform. f(t) in every chip period interval. Instead, a time reference can be obtained from the characteristics of f(t) that may not change as quickly. Three tracking methods are described based on different characteristics of f(t)

Prior art tracking methods include a code tracking circuit in which the receiver attempts to determine the maximum matched filter output value of the chip waveform and sample the signal at that point. However, in multipath fading channels, the receiver despread spreading-code waveform can have a number of local maxima, especially in a mobile environment. In the following, f(t) represents the received signal waveform of the spreading code chip convolved with the channel impulse response. The frequency response characteristic of $f(t)$ and the timing of its maximum correlation can change rather quickly making it impractical to track the maximum of f(t).

Define τ to be the time estimate that the tracking circuit calculates during a particular sampling interval. Also, define the following error function $$\varepsilon = \begin{cases} \int_{\{t: \tau-t > \delta\}} f(t) dt, & |\tau - t| > \delta \\ \varepsilon = 0 & |\tau - t| < \delta \end{cases} \quad \text{Equation 8}$$

The tracking circuits of the prior art calculate a value of the input signal that minimizes the error ε. One can write $$\min \varepsilon = 1 - \max_{\tau} \int_{\tau-\delta}^{\tau+\delta} f(t) dt \quad \text{Equation 9}$$

Assuming f(t) has a smooth frequency response characteristic in the values given, the value of τ for which f(t) is maximum minimizes the error ε, so the tracking circuit tracks the maximum point of f(t)

The Median Weighted Tracking Method minimizes the absolute weighted error, defined as, $$\varepsilon = \int_{-\infty}^{\infty} |t - \tau| f(t) dt \quad \text{Equation 10}$$

This tracking method calculates the "median" signal value of f(t) by collecting information from all paths, where f(t) is as in Equation (6). In a multipath fading environment, the waveform f(t) can have multiple local maxima, but only one median.

To minimize ε, the derivative of Equation (10) is taken with respect to τ and is equated it to zero, which yields Equation (11).

$$\int_{-\infty}^{\tau} f(t) dt = \int_{\tau}^{\infty} f(t) dt \quad \text{Equation 11}$$

Figure 3:
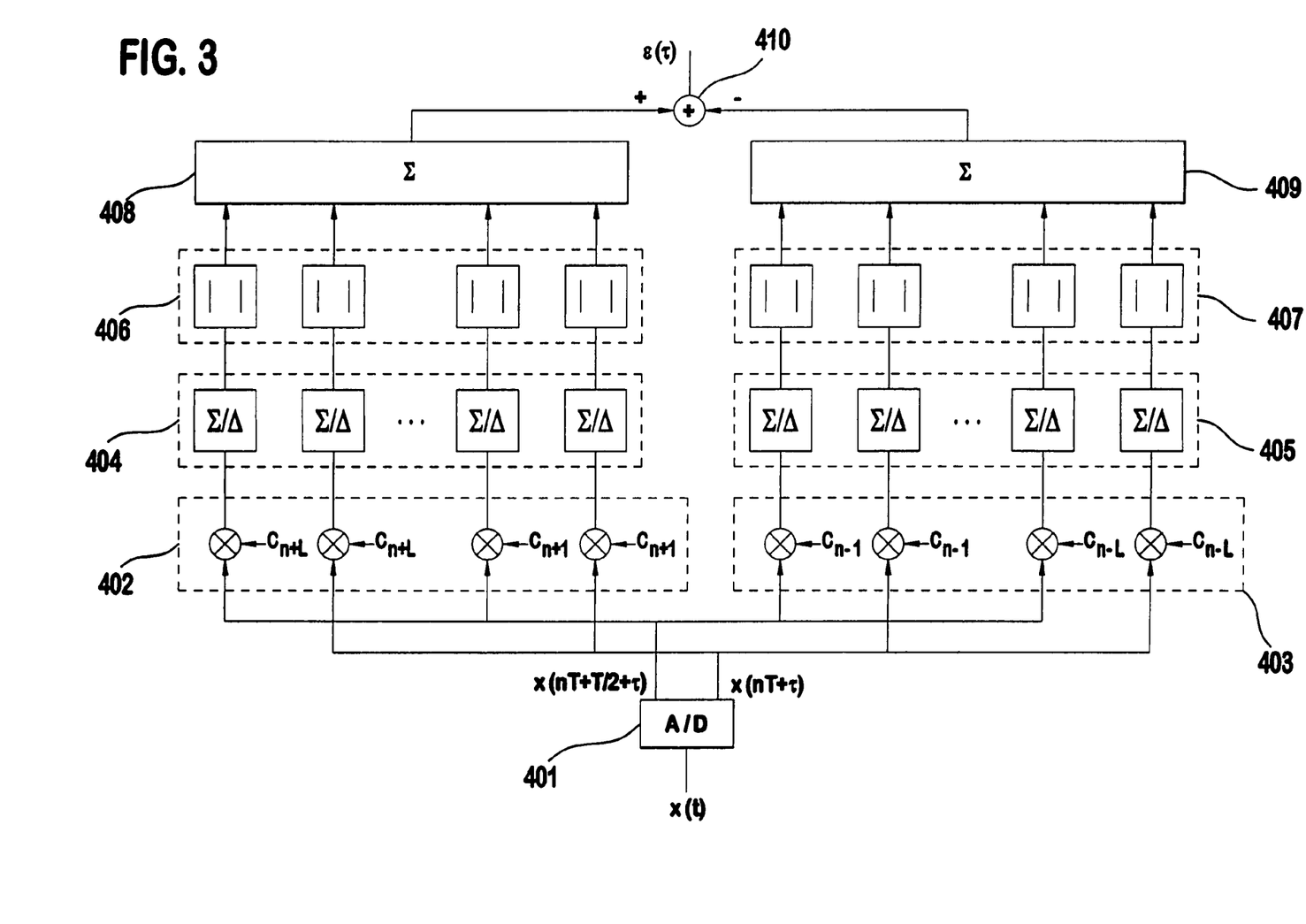
FIG. 3 is a block diagram of the tracking circuit that tracks the median of the received multipath signal components.

The value of τ that satisfies (11) is called the "median" of f(t). Therefore, the Median Tracking Method of the present embodiment tracks the median of f(t). FIG. 3 shows an implementation of the tracking circuit based on minimizing the absolute weighted error defined above. The signal x(t) and its one-half chip offset version x(t+T/2) are sampled by the A/D 401 at a rate 1/T. Equation (12) determines the operating characteristic of the circuit in FIG. 3:

$$\varepsilon(\tau) = \sum_{n=1}^{2L} |f(\tau - nT/2)| - |f(\tau + nT/2)| \quad \text{Equation 12}$$

Tracking the median of a group of multipath signals keeps the received energy of the multipath signal components equal on the early and late sides of the median point of the correct locally generated spreading-code phase $C_n$. The tracking circuit consists of an A/D converter 401 which samples an input signal x(t) to form the half chip offset samples. The half chip offset samples are alternatively grouped into even samples called an early set of samples x(nT+τ) and odd samples called a late set of samples x(nT+(T/2)+τ). The first correlation bank adaptive matched filter 402 multiplies each early sample by the spreading-code phases c(n+1), c(n+2), . . . , c(n+L), where L is small compared to the code length and approximately equal to number of chips of delay between the earliest and latest multipath signal. The output of each correlator is applied to a respective first sum-and-dump bank 404. The magnitudes of the output values of the L sum-and-dump circuits are calculated in the calculator 406 and then summed in summer 408 to give an output value proportional to the signal energy in the early multipath signals. Similarly, a second correlation bank adaptive matched filter 403 operates on the late samples, using code phases c(n−1), c(n−2), . . . , c(n−L), and each output signal is applied to a respective sum-and-dump circuit in an integrator 405. The magnitudes of the output signals of the L sum-and-dump circuits are calculated in calculator 407 and then summed in summer 409 to give a value for the late multipath signal energy. Finally, the adder 410 calculates the difference and produces error signal ε(τ) of the early and late signal energy values.

The tracking circuit adjusts by means of error signal ε(τ) the locally generated code phases c(t) to cause the difference between the early and late values to tend toward 0.

The optimal spreading-code tracking circuit of one embodiment of the present invention is called the squared weighted tracking (or centroid) circuit. Defining τ to denote the time estimate that the tracking circuit calculates, based on some characteristic of .function.(t), the centroid tracking circuit minimizes the squared weighted error defined as $$\varepsilon = \int_{-\infty}^{\infty} |t - \tau|^2 f(t) dt \quad \text{Equation 13}$$

This function inside the integral has a quadratic form, which has a unique minimum. The value of τ that minimizes ε can be found by taking the derivative of the above equation with respect to τ and equating to zero, which gives $$\int_{-\infty}^{\infty} (-2t + 2\tau) f(t) dt = 0 \quad \text{Equation 14}$$

Therefore, the value of τ that satisfies $$\tau - \frac{1}{\beta} \int_{-\infty}^{\infty} tf(t) dt = 0 \quad \text{Equation 15}$$

is the timing estimate that the tracking circuit calculates, and .beta. is a constant value.

Figure 4:
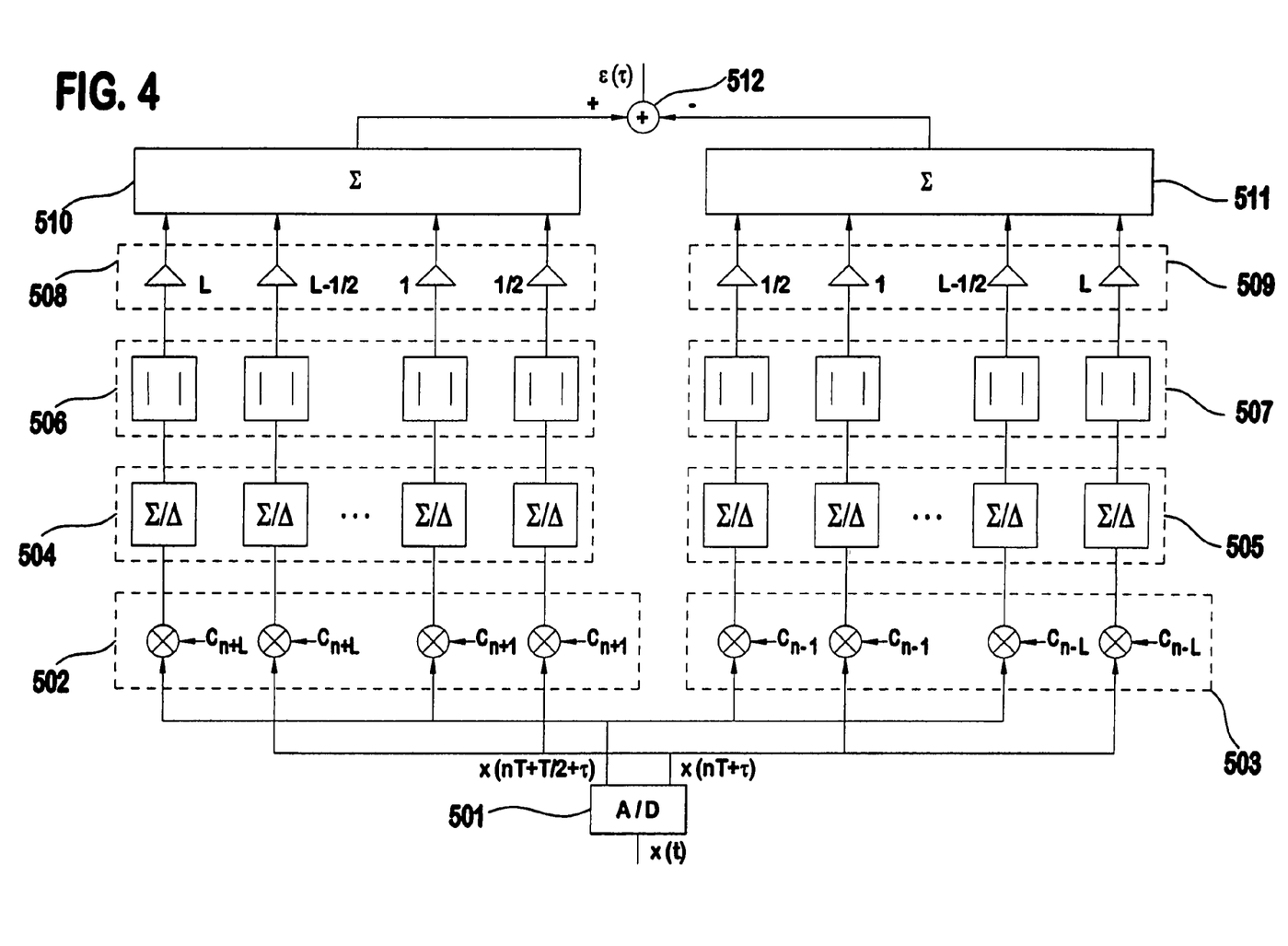
FIG. 4 is a block diagram of the tracking circuit that tracks the centroid of the received multipath signal components.

Based on these observations, a realization of the tracking circuit of the present invention minimizing the squared weighted error is shown in FIG. 4. The following equation determines the error signal ε(τ) of the centroid tracking circuit:

$$\varepsilon(\tau) = \sum_{n=1}^{2L} n[|f(\tau - nT/2)| - |f(\tau + nT/2)|] = 0 \quad \text{Equation 16}$$

The value that satisfies ε(τ)=0 is the perfect estimate of the timing.

The early and late multipath signal energy on each side of the centroid point are equal. The centroid tracking circuit shown in FIG. 4 consists of an A/D converter 501 which samples an input signal x(t) to form the half chip offset samples. The half chip offset samples are alternatively grouped as an early set of samples x(nT+τ) and a late set of samples x(nT+(T/2)+τ). The first correlation bank adaptive matched filter 502 multiplies each early sample and each late sample by the positive spreading-code phases c(n+1), c(n+2), . . . , c(n+L), where L is small compared to the code length and approximately equal to number of chips of delay between the earliest and latest multipath signal. The output signal of each correlator is applied to a respective one of L sum-and-dump circuits of the first sum and dump bank 504. The magnitude value of each sum-and-dump circuit of the sum and dump bank 504 is calculated by the respective calculator in the calculator bank 506 and applied to a corresponding weighting amplifier of the first weighting bank 508. The output signal of each weighting amplifier represents the weighted signal energy in a multipath component signal.

The weighted early multipath signal energy values are summed in sample adder 510 to give an output value proportional to the signal energy in the group of multipath signals corresponding to positive code phases which are the early multipath signals. Similarly, a second correlation bank adaptive matched filter 503 operates on the early and late samples, using the negative spreading phases c(n−1), c(n−2), . . . , c(n−L), each output signal is provided to a respective sum-and-dump circuit of discrete integrator 505. The magnitude value of the L sum-and-dump output signals is calculated by the respective calculator of calculator bank 507 and then weighted in weighting bank 509. The weighted late multipath signal energy values are summed in sample adder 511 to give an energy value for the group of multipath signals corresponding to the negative code phases which are the late multipath signals. Finally, the adder 512 calculates the difference between the early and late signal energy values to produce error sample value ε(τ).

The tracking circuit of FIG. 4 produces error signal ε(τ) which is used to adjust the locally generated code phase c(nT) to keep the weighted average energy in the early and late multipath signal groups equal. The embodiment shown uses weighting values that increase as the distance from the centroid increases. The signal energy in the earliest and latest multipath signals is probably less than the multipath signal values near the centroid. Consequently, the difference calculated by the adder 510 is more sensitive to variations in delay of the earliest and latest multipath signals.

In another embodiment of the tracking method, the tracking circuit adjusts sampling phase to be "optimal" and robust to multipath. Let f(t) represent the received signal waveform as in Equation 16 above. The particular method of optimizing starts with a delay locked loop with an error signal $\epsilon(\tau)$ that drives the loop. The function $\epsilon(\tau)$ must have only one zero at $\tau=\tau_0$ where $\tau_0$ is optimal. The optimal form for $\epsilon(\tau)$ has the canonical form $$\varepsilon(\tau) = \int_{-\infty}^{\infty} w(t,\tau)|f(t)|^2 dt \qquad \text{Equation 17}$$

where $w(t, \tau)$ is a weighting function relating $f(t)$ to the error $\epsilon(\tau)$, and the following holds $$\varepsilon(\tau + \tau_0) = \int_{-\infty}^{\infty} w(t, \tau + \tau_0)|f(t)|^2 dt \qquad \text{Equation 18}$$

It follows from Equation 18 that $w(t, \tau)$ is equivalent to $w(t-\tau)$. Considering the slope M of the error signal in the neighborhood of a lock point $\tau_0$:

$$M = \frac{d\varepsilon(\tau)}{d\tau}\bigg|_{\tau_0} = -\int_{-\infty}^{\infty} w'(t-\tau_0)g(t)dt \qquad \text{Equation 19}$$

where $w'(t, \tau)$ is the derivative of $w(t, \tau)$ with respect to $\tau$, and $g(t)$ is the to average of $|f(t)|^2$.

The error $\epsilon(\tau)$ has a deterministic part and a noise part. Let z denote the noise component in $\epsilon(\tau)$, then $|z|^2$ is the average noise power in the error function $\epsilon(\tau)$. Consequently, the optimal tracking circuit maximizes the ratio $$F = \frac{M^2}{|z|^2} \qquad \text{Equation 20}$$

Figure 5:
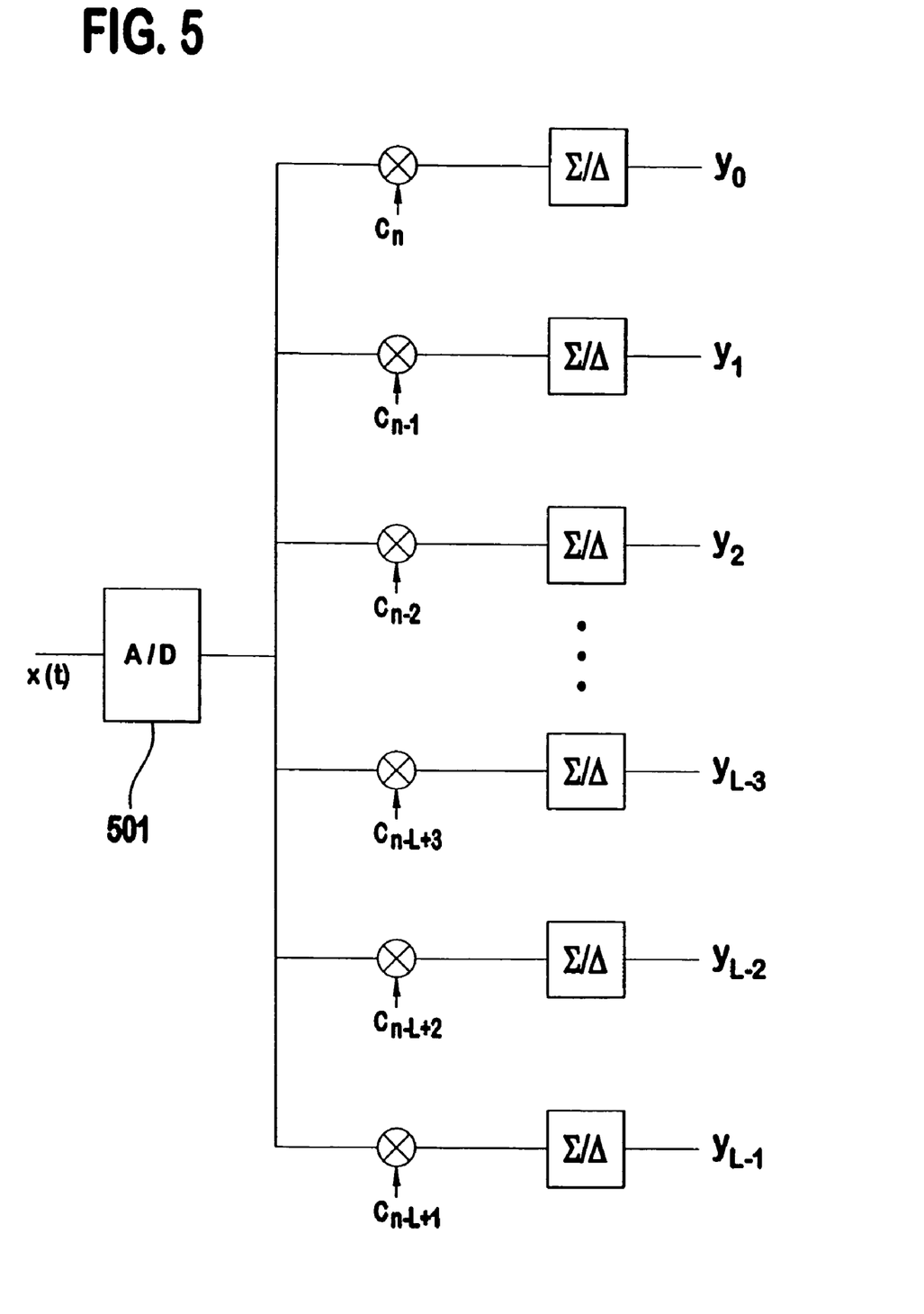
FIG. 5 is a block diagram of the correlating circuit which creates a tracking vector signal for a generalized quadratic tracking detector.

The implementation of the Quadratic Detector is now described. The discrete error value e of an error signal $\epsilon(\tau)$ is generated by performing the operation $$e = y^T B y \qquad \text{Equation 21}$$

where the vector y represents the received signal components $y_i$, $i=0, 1, \ldots L-1$, as shown in FIG. 5. The matrix B is an L by L matrix and the elements are determined by calculating values such that the ratio F of Equation 20 is maximized.

The Quadratic Detector described above may be used to implement the centroid tracking system described above with reference to FIG. 4. For this implementation, the vector y is the output signal of the sum and dump circuits 504: y={f($\tau$-LT), f($\tau$-LT+T/2), f($\tau$-(L-1)T), ... f($\tau$, f($\tau$+T/2), f($\tau$+T), ... f($\tau$+LT)} and the matrix B is set forth in Table 1.

TABLE 1

B matrix for quadratic form of Centroid Tracking System

| L | 0 | 0 | 0 | 0 | 0 | 0 | 0 | 0 | 0 | 0 |
|---|---|---|---|---|---|---|---|---|---|---|
| 0 | L-1/2 | 0 | 0 | 0 | 0 | 0 | 0 | 0 | 0 | 0 |
| 0 | 0 | L-1 | 0 | 0 | 0 | 0 | 0 | 0 | 0 | 0 |
| ⋮ | ⋮ | ⋮ | ⋱ | ⋮ | ⋮ | ⋮ | ⋮ | ⋮ | ⋮ | ⋮ |
| 0 | 0 | 0 | 0 | 1/2 | 0 | 0 | 0 | 0 | 0 | 0 |
| 0 | 0 | 0 | 0 | 0 | 0 | 0 | 0 | 0 | 0 | 0 |
| 0 | 0 | 0 | 0 | 0 | 0 | -1/2 | 0 | 0 | 0 | 0 |
| ⋮ | ⋮ | ⋮ | ⋮ | ⋮ | ⋮ | ⋮ | ⋱ | ⋮ | ⋮ | ⋮ |
| 0 | 0 | 0 | 0 | 0 | 0 | 0 | 0 | -L+1 | 0 | 0 |
| 0 | 0 | 0 | 0 | 0 | 0 | 0 | 0 | 0 | -L+1/2 | 0 |
| 0 | 0 | 0 | 0 | 0 | 0 | 0 | 0 | 0 | 0 | -L |

To understand the operation of the Quadratic Detector, it is useful to consider the following. A spread spectrum (CDMA) signal, s(t) is passed through a multipath channel with an impulse response $h_c$ (t). The baseband spread signal is described by Equation (22).

$$s(t) = \sum_i C_i p(t - iT_c) \qquad \text{Equation 22}$$

where $C_i$ is a complex spreading code symbol, p(t) is a predefined chip pulse and $T_c$ is the chip time spacing, where $T_c=1/R_c$ and $R_c$ is the chip rate.

The received baseband signal is represented by Equation (23)

$$r(t) = \sum_i C_i q(t - iT_c - \tau) + n(t) \qquad \text{Equation 23}$$

where $q(t)=p(t))*h_c(t)$, $\tau$ is an unknown delay and n(t) is additive noise. The received signal is processed by a filter, $h_R$ (t), so the waveform, x(t), to be processed is given by Equation (24).

$$x(t) = \sum_i C_i f(t - iT_c - \tau) + z(t) \qquad \text{Equation 24}$$

where $f(t)=q(t)*h_R$ (t) and $z(t)=n(t)*h_R$ (t).

In the exemplary receiver, samples of the received signal are taken at the chip rate, that is to say, $1/T_c$. These samples, $x(mT_c+\tau')$, are processed by an array of correlators that compute, during the $r^{th}$ correlation period, the quantities given by Equation (25)

$$v_k^{(r)} = \sum_{m=rL}^{rL+L-1} x(mT_c + \tau')C_{m-k}^* \qquad \text{Equation 25}$$

These quantities are composed of a noise component $w_k(r)$ and a deterministic component $y_k(r)$ given by Equation (26).

$$y_k^{(r)} = E[v_k^{(r)}] = Lf(kT_c + \tau' - \tau) \qquad \text{Equation 26}$$

In the sequel, the time index r may be suppressed for ease of writing, although it is to be noted that the function f(t) changes slowly with time.

The samples are processed to adjust the sampling phase, $\tau'$, in an optimum fashion for further processing by the receiver, such as matched filtering. This adjustment is described below. To simplify the representation of the process, it is helpful to describe it in terms of the function $f(t+\tau)$, where the time-shift, $\tau$, is to be adjusted. It is noted that the function $f(t+\tau)$ is measured in the presence of noise. Thus, it may be problematical to adjust the phase $\tau'$ based on measurements of the signal $f(t+\tau)$. To account for the noise, the function $v(t)$: $v(t)=f(t)+m(t)$ is introduced, where the term $m(t)$ represents a noise process. The system processor may be derived based on considerations of the function $v(t)$.

The process is non-coherent and therefore is based on the envelope power function $|v(t+\tau)|^2$. The functional $e(\tau')$ given in Equation (27) is helpful for describing the process.

$$e(\tau') = \int_{-\infty}^{\infty} |v(t+\tau'-\tau)|^2 dt - \int_{0}^{\infty} |v(t+\tau'-\tau)|^2 dt \quad \text{Equation 27}$$

The shift parameter is adjusted for $e(\tau')=0$, which occurs when the energy on the interval $(-\infty,\tau'-\tau]$ equals that on the interval $[\tau'-\tau, \infty)$ The error characteristic is monotonic and therefore has a single zero crossing point. This is the desirable quality of the functional. A disadvantage of the functional is that it is ill-defined because the integrals are unbounded when noise is present. Nevertheless, the functional $e(\tau')$ may be cast in the form given by Equation (28).

$$e(\tau') = \int_{-\infty}^{\infty} w(t)|v(t+\tau'-\tau)|^2 dt \quad \text{Equation 28}$$

where the characteristic function $w(t)$ is equal to $\text{sgn}(t)$, the signum function.

To optimize the characteristic function $w(t)$, it is helpful to define a figure of merit, F, as set forth in Equation (29).

$$F = \frac{[e(\tau_0' + T_A) - e(\tau_0' - T_A)]^2}{\text{VAR}\{e(\tau_0')\}} \quad \text{Equation 29}$$

The numerator of F is the numerical slope of the mean error characteristic on the interval $[-T_A, T_A]$ surrounding the tracked value, $\tau_0'$. The statistical mean is taken with respect to the noise as well as the random channel, $h_c(t)$. It is desirable to specify a statistical characteristic of the channel in order to perform this statistical average. For example, the channel may be modeled as a Wide Sense Stationary Uncorrelated Scattering (WSSUS) channel with impulse response $h_c(t)$ and a white noise process $U(t)$ that has an intensity function $g(t)$ as shown in Equation (30).

$$h_c(t) = \sqrt{g(t)} U(t) \quad \text{Equation 30}$$

The variance of $e(\tau)$ is computed as the mean square value of the fluctuation $$e'(\tau) = e(\tau) - \langle e(\tau) \rangle \quad \text{Equation 31}$$

where $\langle e(\tau) \rangle$ is the average of $e(\tau)$ with respect to the noise.

Optimization of the figure of merit F with respect to the function $w(t)$ may be carried out using well-known Variational methods of optimization.

Once the optimal $w(t)$ is determined, the resulting processor may be approximated accurately by a quadratic sample processor which is derived as follows.

By the sampling theorem, the signal $v(t)$, bandlimited to a bandwidth W may be expressed in terms of its samples as shown in Equation (32).

$$v(t) = \Sigma v(k/W) \text{sinc}[(Wt-k)\pi] \quad \text{Equation 32}$$

substituting this expansion into equation (z+6) results in an infinite quadratic form in the samples $v(k/W+\tau'-\tau)$. Making the assumption that the signal bandwidth equals the chip rate allows the use of a sampling scheme that is clocked by the chip clock signal to be used to obtain the samples. These samples, vk are represented by Equation (33).

$$v_k = v(kT_c + \tau' - \Sigma) \quad \text{Equation 33}$$

This assumption leads to a simplification of the implementation. It is valid if the aliasing error is small.

In practice, the quadratic form that is derived is truncated. An example normalized B matrix is given below in Table 2. For this example, an exponential delay spread profile $g(t) = \exp(-t/T)$ is assumed with .tau. equal to one chip. An aperture parameter $T_A$ equal to one and one-half chips has also been assumed. The underlying chip pulse has a raised cosine spectrum with a 20% excess bandwidth.

TABLE 2

Example B matrix

| | | | | | | | | | | |
|---|---|---|---|---|---|---|---|---|---|---|
| 0 | 0 | 0 | 0 | 0 | 0 | 0 | 0 | 0 | 0 | 0 |
| 0 | 0 | -0.1 | 0 | 0 | 0 | 0 | 0 | 0 | 0 | 0 |
| 0 | -0.1 | 0.22 | 0.19 | -0.19 | 0 | 0 | 0 | 0 | 0 | 0 |
| 0 | 0 | 0.19 | 1 | 0.45 | -0.2 | 0 | 0 | 0 | 0 | 0 |
| 0 | 0 | -0.19 | 0.45 | 0.99 | 0.23 | 0 | 0 | 0 | 0 | 0 |
| 0 | 0 | 0 | -0.2 | 0.23 | 0 | -0.18 | 0.17 | 0 | 0 | 0 |
| 0 | 0 | 0 | 0 | 0 | -0.18 | -0.87 | -0.42 | 0.18 | 0 | 0 |
| 0 | 0 | 0 | 0 | 0 | 0.17 | -0.42 | -0.92 | -0.16 | 0 | 0 |
| 0 | 0 | 0 | 0 | 0 | 0 | 0.18 | -0.16 | -0.31 | 0 | 0 |
| 0 | 0 | 0 | 0 | 0 | 0 | 0 | 0 | 0 | -0.13 | 0 |
| 0 | 0 | 0 | 0 | 0 | 0 | 0 | 0 | 0 | 0 | 0 |

Code tracking of the above form in a CDMA system employing a Pilot signal can be implemented via a loop phase detector that is implemented in a digital signal processing device (DSP) as follows. The vector y is defined as a column vector which represents the 11 complex output level values of the Pilot AVC 1711, and B denotes an 11×11 symmetric real valued coefficient matrix with pre-determined values to optimize performance with the non-coherent Pilot AVC output values y. The output signal of the phase detector is given by Equation (21).

The following calculations are then performed to implement a proportional plus integral loop filter and the VCO:

$$x[n] = x[n-1] + \beta \epsilon \quad \text{Equation 34}$$

$$z[n] = z[n-1] + x[n] + \beta \epsilon \quad \text{Equation 35}$$

for β and α which are constants chosen from modeling the system to optimize system performance for the particular transmission channel and application, and where x[n] is the loop filter's integrator output value and z[n] is the VCO output value. The code phase adjustments are made by the modem controller the following C-subroutine:

```
if (z > zmx) }
delay phase 1/16 chip;
z - = zmax;
} else if (z < -zmax) {
advance phase 1/16 chip;
z + = zmax;
}
```

The value of L in the previous section determines the minimum number of correlators and sum-and-dump elements. L is chosen as small as possible without compromising the functionality of the tracking circuit.

The multipath characteristic of the channel is such that the received chip waveform f(t) is spread over $QT_c$ seconds, or the multipath components occupy a time period of Q chips duration. The value of L chosen is L=Q. Q is found by measuring the particular RF channel transmission characteristics to determine the earliest and latest multipath component signal propagation delay. $QT_c$ is the difference between the earliest and latest multipath component arrival time at a receiver.

The previous description of acquisition and tracking algorithm focuses on a non-coherent method because the acquisition and tracking algorithm described requires non-coherent acquisition following by non-coherent tracking because during acquisition a coherent reference is not available until the AMF, Pilot AVC, Aux AVC, and DPLL are in an equilibrium state. However, it is known in the art that coherent tracking and combining is always optimal because in non-coherent tracking and combining the output phase information of each Pilot AVC finger is lost. Consequently, another embodiment of the invention employs a two step acquisition and tracking system, in which the previously described non-coherent acquisition and tracking algorithm is implemented first, and then the algorithm switches to a coherent tracking method. The coherent combining and tracking method is similar to that described previously, except that the error signal tracked is of the form:

$$\epsilon = y^T A y \quad \text{Equation 36}$$

where y is defined as a column vector which represents the 11 complex output level values of the Pilot AVC 1711, and A denotes an 11.times. 11 symmetric real valued coefficient matrix with pre-determined values to optimize performance with the coherent Pilot AVC outputs y. An exemplary A matrix is shown below.

$$A = \begin{pmatrix} 1 & 0 & 0 & 0 & 0 & 0 & 0 & 0 & 0 & 0 & 0 \\ 0 & 1 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 1 & 0 & 0 & 0 & 0 & 0 & 0 \\ 0 & 0 & 0 & 0 & 0 & 0 & 0 & 0 & 0 & 0 & 0 \\ 0 & 0 & 0 & 0 & 0 & 0 & -1 & 0 & 0 & 0 & 0 \\ 0 & 0 & 0 & 0 & 0 & 0 & 0 & -1 & 0 & 0 & 0 \\ 0 & 0 & 0 & 0 & 0 & 0 & 0 & 0 & -1 & 0 & 0 \\ 0 & 0 & 0 & 0 & 0 & 0 & 0 & 0 & 0 & -1 & 0 \\ 0 & 0 & 0 & 0 & 0 & 0 & 0 & 0 & 0 & 0 & -1 \end{pmatrix}$$

While the present invention has been described in terms of exemplary embodiments, it is understood by one skilled in the are that it may be practiced as described above with variations within the scope of the following claims.

What is claimed is:

1. A method implemented in a communication device for tracking a spread spectrum signal having an associated code at a receiver, the method comprising:
   despreading by a despreading device a plurality of components of the spread spectrum signal using the associated code, each of the plurality of components having a different code phase than all others of the plurality of code phases;
   weighting each of the plurality of components with a weight value based on a phase difference between that component and a center code phase of the plurality of components; and
   determining a tracking error based on the weighted components.

2. The method of claim 1 further comprising adjusting a phase of the center code phase in response to the tracking error.

3. The method of claim 1 wherein the weight values are proportional to a phase difference of each of the plurality of components and the center code phase.

4. The method of claim 1 wherein the weight values are proportional to a square of a phase difference of each of the plurality of components and the center code phase.

5. A circuit for tracking a spread spectrum signal having an associated code, the circuit comprising:
   an input configured to receive a received signal;
   a despread device configured to despread the received signal to produce a plurality of components of the spread spectrum signal using the associated code, each of the plurality of components having a different code phase than all others of the plurality of components; and
   a weight device configured to weigh each of the plurality of components with a weight value based on a phase difference between that component and a center code phase of the plurality of components, and to determine a tracking error based on the weighted components.

6. The circuit of claim 5 wherein a phase of the center code phase is adjusted in response to the tracking error.

7. The circuit of claim 5 wherein the weight device weighs proportional to a phase difference of each of the plurality of components and the center code phase.

8. The circuit of claim 5 wherein the weight device weighs proportional to a square of a phase difference of each of the plurality of components and the center code phase.

9. A circuit for tracking a spread spectrum signal having an associated code, the circuit comprising:

an input configured to receive a received signal;

a plurality of adaptive matched filters configured to despread the received signal to produce a plurality of components of the spread spectrum signal using the associated code, each of the plurality of components having a different code phase than all others of the plurality of components;

a weighting bank configured to weigh each of the plurality of components with a weight value based on a phase difference between that component and a center code phase of the plurality of components; and an adder configured to add the weighted components to determine a tracking error.

10. The circuit of claim 9 wherein a phase of the center code phase is adjusted in response to the tracking error.

11. The circuit of claim 9 wherein the weight values are proportional to a phase difference of each of the plurality of components and the center code phase.

12. The circuit of claim 9 wherein the weight values are proportional to a square of a phase difference of each of the plurality of components and the center code phase.

* * * * *

UNITED STATES PATENT AND TRADEMARK OFFICE
CERTIFICATE OF CORRECTION

| | | |
|---|---|---|
| PATENT NO. | : 7,593,453 B2 | Page 1 of 1 |
| APPLICATION NO. | : 10/788209 | |
| DATED | : September 22, 2009 | |
| INVENTOR(S) | : Lomp et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1153 days.

Signed and Sealed this

Twenty-first Day of September, 2010

David J. Kappos
*Director of the United States Patent and Trademark Office*